(12) United States Patent
Phillips et al.

(10) Patent No.: US 10,072,859 B2
(45) Date of Patent: Sep. 11, 2018

(54) INVERTED EXHAUST PLENUM MODULE

(71) Applicant: Amazon Technologies, Inc., Reno, NV (US)

(72) Inventors: Matthew Thomas Phillips, Bainbridge Island, WA (US); Robert David Wilding, Seattle, WA (US); Brock Robert Gardner, Seattle, WA (US); Peter George Ross, Olympia, WA (US); Timothy Logan Sadler, Edmonds, WA (US)

(73) Assignee: AmazonTechnologies, Inc., Reno, NV (US)

( * ) Notice: Subject to any disclaimer, the term of this patent is extended or adjusted under 35 U.S.C. 154(b) by 981 days.

(21) Appl. No.: 14/308,114

(22) Filed: Jun. 18, 2014

(65) Prior Publication Data

US 2015/0369500 A1    Dec. 24, 2015

(51) Int. Cl.
*F24F 7/02*  (2006.01)
*G06F 1/16*  (2006.01)
(Continued)

(52) U.S. Cl.
CPC .............. *F24F 7/02* (2013.01); *G06F 1/16* (2013.01); *H05K 7/20745* (2013.01);
(Continued)

(58) Field of Classification Search
CPC .. F24F 7/02; F24F 2007/004; F24F 2007/001; F24F 13/08; F24F 1/16; G06F 1/16; H05K 7/20745; A01B 12/006
(Continued)

(56) References Cited

U.S. PATENT DOCUMENTS

| 835,966 | A | * | 11/1906 | Lyster | E04D 3/40 |
| | | | | | 454/199 |
| 1,906,158 | A | * | 4/1933 | John | F24F 7/02 |
| | | | | | 454/367 |

(Continued)

FOREIGN PATENT DOCUMENTS

| GB | 2485469 | 5/2012 |
| JP | 59044536 A * | 3/1984 ........... E04D 13/174 |

(Continued)

OTHER PUBLICATIONS

"JP_61015029_A_M—Machine Translate.pdf", Machine translation, JPO.org.*

(Continued)

*Primary Examiner* — Gregory Huson
*Assistant Examiner* — Daniel E Namay
(74) *Attorney, Agent, or Firm* — Robert C. Kowert; Meyertons, Hood, Kivlin, Kowert & Goetzel, P.C.

(57) ABSTRACT

An inverted exhaust plenum module exhausts air from an enclosure into an ambient environment while mitigating airflow restrictions caused by ambient wind conditions, particularly headwinds impinging on exhaust vents. The plenum module includes wall elements that extend downwards from separate edges of two separate roof elements of the enclosure, forming a plenum between the wall elements that is open at the top. Exhaust vents in the wall elements exhaust air from the enclosure into the plenum to circulate into the ambient environment via the top of the plenum. By exhausting air into a plenum that extends beneath roof elements, the vents are at least partially obscured from ambient winds that might otherwise impinge on the vents. A wing element can be installed to induce exhaust airflow via lowering air pressure at the top of the plenum. The plenum (Continued)

module can be a separate module that is coupled to a structure.

20 Claims, 12 Drawing Sheets

(51) Int. Cl.
  *H05K 7/20* (2006.01)
  *H05K 7/02* (2006.01)
  *F24F 13/08* (2006.01)
  *F24F 7/00* (2006.01)
(52) U.S. Cl.
  CPC ......... *F24F 13/08* (2013.01); *F24F 2007/001* (2013.01); *F24F 2007/004* (2013.01)
(58) Field of Classification Search
  USPC ............................... 454/367, 185, 358, 365
  See application file for complete search history.

(56) References Cited

U.S. PATENT DOCUMENTS

| | | | | |
|---|---|---|---|---|
| 2,601,423 | A * | 6/1952 | Allman | F24F 7/02 454/363 |
| 3,185,070 | A * | 5/1965 | Smith | E04D 13/174 454/365 |
| 3,213,776 | A * | 10/1965 | Adams | F24F 7/02 454/362 |
| 3,853,042 | A * | 12/1974 | Tobiasson | F24F 7/02 454/3 |
| 4,572,059 | A * | 2/1986 | Ramsay | F24F 7/02 454/365 |
| 4,609,126 | A | 9/1986 | Janda | |
| 4,790,237 | A * | 12/1988 | Usuda | F24F 7/02 137/870 |
| 6,093,098 | A * | 7/2000 | Wilhelmson | F24F 7/02 454/365 |
| 6,129,628 | A * | 10/2000 | O'Hagin | F24F 7/02 454/366 |
| 6,422,936 | B1 * | 7/2002 | Van Gilst | F24F 7/02 454/365 |
| 6,598,668 | B1 | 7/2003 | Cosley et al. | |
| 6,643,130 | B1 | 11/2003 | Demarchis et al. | |
| 7,430,118 | B1 * | 9/2008 | Noteboom | H05K 7/20745 165/104.33 |
| 9,395,974 | B1 * | 7/2016 | Eichelberg | G06F 8/65 |
| 2008/0256883 | A1 * | 10/2008 | Fleckenstein | F23L 17/02 52/244 |
| 2010/0056038 | A1 * | 3/2010 | Ramsay | F24F 7/02 454/364 |
| 2010/0144265 | A1 * | 6/2010 | Bednarcik | H05K 7/20745 454/184 |
| 2010/0263830 | A1 * | 10/2010 | Noteboom | H05K 7/2079 165/80.2 |
| 2011/0300788 | A1 * | 12/2011 | Caveney | H05K 7/20736 454/184 |
| 2012/0289144 | A1 * | 11/2012 | Brown | F24F 7/007 454/341 |
| 2012/0304567 | A1 * | 12/2012 | Baker, IV | F24F 7/02 52/302.1 |
| 2013/0225066 | A1 * | 8/2013 | Trubnikow | E04C 2/425 454/367 |
| 2013/0244563 | A1 * | 9/2013 | Noteboom | F24F 11/0001 454/250 |
| 2013/0283708 | A1 * | 10/2013 | Barre | F24F 7/02 52/95 |
| 2014/0220882 | A1 * | 8/2014 | Huang | F24F 7/02 454/364 |
| 2014/0331582 | A1 * | 11/2014 | Klaba | H05K 7/20745 52/234 |
| 2017/0176029 | A1 * | 6/2017 | Wilding | F24F 7/02 |

FOREIGN PATENT DOCUMENTS

| | | | | |
|---|---|---|---|---|
| JP | 61015029 | A * | 1/1986 | ................ F24F 7/02 |
| JP | 62-153457 | | 7/1987 | |
| JP | Hei 2-98104 | | 8/1990 | |
| JP | H0510009 | | 1/1993 | |
| JP | 2004222510 | | 8/2004 | |
| JP | 2010121274 | | 6/2010 | |
| JP | 2011012483 | | 1/2011 | |
| WO | 2011146063 | | 11/2011 | |

OTHER PUBLICATIONS

International Search Report and Written Opinion from PCT/US2015/036406, dated Sep. 18, 2015, Amazon Technologies, Inc., pp. 1-12.
"The Road to Passive Cooling Why CPI's Ducted Exhaust Cabinets are More Efficient than Alternatives", Chatsworth Products, Inc., 2009, pp. 1-6.
"Data Center Best Practices Guide; Energy Efficiency Solutions for High-Performance Data Centers", PG&E, Oct. 2012, pp. 1-79.
Office Action from Japanese Patent Application No. 2016-573054, dated Nov. 28, 2017 (English translation and Japanese Version), pp. 1-9.

* cited by examiner

INVERTED EXHAUST PLENUM MODULE

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Various structures with waste heat sources often include methods and apparatuses configured to facilitate waste heat removal from some part of the structure. Where a structure includes an enclosure in which waste heat sources are located, the methods and apparatuses may be configured to facilitate waste heat removal from the waste heat sources the enclosure, or some combination thereof. For example, a data center may include methods and apparatuses may be configured to facilitate waste heat removal from a plurality of rack computing systems.

Some waste heat removal systems remove waste heat from data centers by transferring waste heat to flows of air ("exhaust air"), which are then used to transport the waste heat to an environment external to the data center. Such an environment can include an ambient environment.

Waste heat removal systems often use mechanical systems that use moving parts to facilitate waste heat removal from the data centers. For example, some waste heat removal systems in some data centers may utilize air moving devices, including blowers, fans, or the like, to induce one or more flows of air, including exhaust air, to transport waste heat out of the data center. Such systems usually consume electricity and may themselves generate waste heat, further increasing the amount of waste heat that must be removed from the data center and necessitating the mechanical systems to be enlarged to handle the greater waste heat load. Some waste heat removal systems do not use air moving devices to remove waste heat from a data center, and may use a pressure gradient towards the ambient environment from the data center enclosure to induce exhaust airflow out of the data center and into the ambient environment.

Environmental conditions of an ambient environment may be non-uniform and may fluctuate with minimal warning, even at a given location. Aside from the significant changes in temperature and humidity that can occur with the change of seasons, environmental quality of the ambient environment may vary due to a myriad of external factors. Such variation in environmental conditions can create challenges in removing waste heat from an enclosure that has waste heat sources to the ambient environment. For example, precipitation, including rain, snow, ice, hail, and the like, smoke, smog, particulate matter, and airborne by-products of industrial and/or agricultural activities can all affect usability of outside air as a reservoir for air carrying waste heat and can further enter the data center through pathways normally used to expel waste heat into the ambient environment and may contaminate or damage various systems in the data center.

In some cases, environmental conditions of an ambient environment can cause exhaust air flow from a data center to be at least partially restricted by reducing the surface area of exhaust vents that is available to discharge exhaust air from the data center enclosure. For example, ambient air flow in the ambient environment, including ambient headwinds, may impinge on one or more exhaust vents used to discharge exhaust air from the enclosure.

In some cases, where a waste heat removal system in the data center induces an exhaust airflow into the ambient environment is induced by air moving devices, an impinging headwind can result in reduced exhaust airflow for a given amount of power supplied to the air moving devices, thereby making the vent being impinged by the headwind less suitable for exhaust air discharge. While the air moving devices may be supplied additional power to overcome the impinging headwind, such an additional use of power may be considered to be a waste of resources.

In some cases, where a waste heat removal system in the data center includes a passive exhaust system, and exhaust air is discharged from the vents into the ambient environment via a pressure gradient towards the ambient environment across the vents, an impinging headwind can eliminate or reverse the pressure gradient, thereby making the surface area of the vent being impinged by the headwind unavailable for discharging exhaust air.

As a result, the ability of a waste heat removal system to discharge exhaust air from the data center, and thus remove waste heat from same, may be at least partially restricted by headwinds impinging on at least a portion of one or more exhaust vents. Such restriction can lead to excess waste heat buildup in the data center enclosure, which can lead to thermal damage risks for heat-sensitive equipment and safety risks for operators in the data center.

Figure 1:
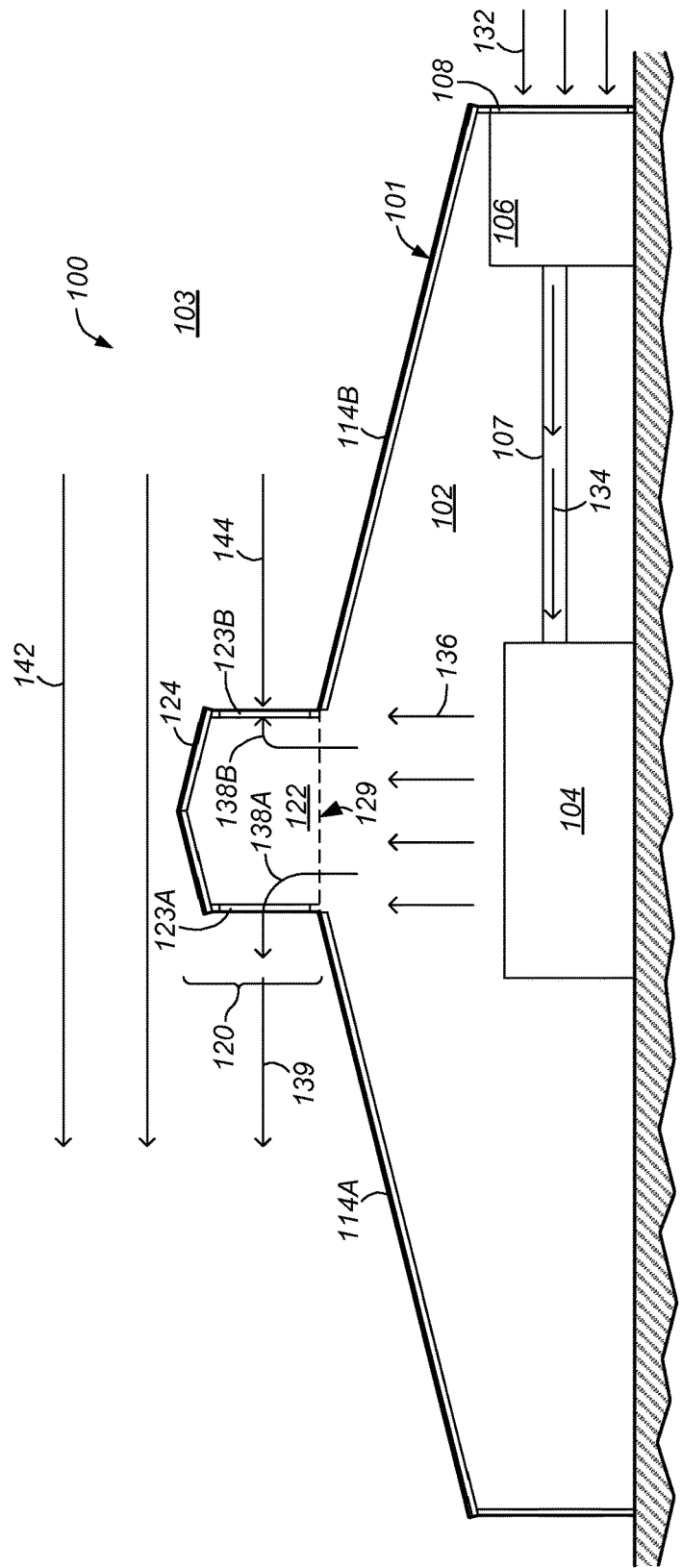
FIG. 1 is a cross-sectional schematic view of a data center that includes an upright exhaust plenum module according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an inverted exhaust plenum module are disclosed. According to one embodiment, a data center structure includes an enclosure in which one or more computer systems are installed, and which discharge exhaust air into the enclosure, and an inverted exhaust plenum module that discharges exhaust air from the enclosure into an ambient environment without restriction by ambient air flows. The inverted exhaust plenum module includes at least two angled roof elements that bound a top end of the enclosure and are each angled towards separate edges along the top end. The module also includes an exhaust plenum that projects downwards from, and between, the separate edges, and is open to the ambient environment at an upper end. The module also includes vertically-oriented wall elements that each project downwards from the separate edges to establish opposite sides of the exhaust plenum. Each vertical wall element includes an exhaust vent that can discharge exhaust air from the enclosure into the exhaust plenum. The module at least partially obscures the exhaust vents from exposure to impingement by ambient air flows flowing over the upper end of the exhaust plenum. According to one embodiment, the module, the module at least partially obscures the exhaust vents from exposure to impingement by ambient air flows flowing over the upper end of the exhaust plenum, so that exhaust air flow through the exhaust vents is free from restriction due to headwinds impinging on the exhaust vents.

According to one embodiment, an apparatus includes an inverted exhaust plenum module that discharges exhaust air received from an enclosure space into an ambient environment. The inverted exhaust plenum module includes an exhaust plenum and at least one exhaust vent. The exhaust plenum projects downwards from nearby edges of separate roof elements. The exhaust plenum includes an upper end that spans between the separate edges and is open to the ambient environment and opposite side ends. The exhaust vent is coupled to at least one side end of the exhaust plenum extending beneath at least one of the separate roof element edges and discharges exhaust air from the enclosure space into the exhaust plenum. The exhaust vents in the inverted exhaust plenum module are at least partially obscured from exposure to impingement by ambient air flows.

According to one embodiment, a method includes configuring an enclosure to provide headwind-resistant air discharge into an ambient environment. Such configuring includes coupling wall elements to separate roof element edges and installing an exhaust vent in one or more of the wall elements. The wall elements are coupled to the separate roof element edges so that the wall elements project downwards from the separate edges along opposite sides of an open space to establish an exhaust plenum. The exhaust plenum is open to the ambient environment at an upper end that spans between the separate edges. The exhaust vents discharge air into the exhaust plenum in at least partial obscurity from exposure to impingement by ambient air flows flowing over the upper end of the exhaust plenum.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "ambient" refers to a condition of outside air at the location of a system, structure, data center, etc. An ambient temperature may be taken, for example, at or near an intake hood of an air handling system.

As used herein, Bernoulli's principle refers to the principle that fluid speed, in some cases, is in an inversely proportional relationship with one or more of the fluid pressure or potential energy. For example, an increase in fluid speed can occur proportionately with an increase in fluid dynamic pressure and kinetic energy and a decrease in fluid static pressure and potential energy. Application of Bernoulli's principle includes application of the Venturi effect, such that an airflow with a given flow rate through a restricted cross-sectional flow area has a reduced static pressure relative to airflow with the given flow rate through a larger cross-sectional flow area.

As used herein, a "chimney effect" or "stack effect" refers to a flow of air through a pathway that is induced by an air density difference between the ends of the pathway. Such a difference may be induced by one or more various factors, including temperature differences between the ends of the pathway, ambient pressure differences, humidity differences, and the like. For example, where a building with a warm enclosure is surrounded by a colder ambient environment, the chimney effect may refer to an induced flow of air through a pathway (e.g., a chimney) between the enclosure and the environment that is induced by an air-density difference between the lower-density warmer air of the enclosure passing through the pathway to the environment while being displaced by the higher-density colder air from the environment.

As used herein, "room" means a room or a space of a structure. A "computer room" means a room in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct, conduit, or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "adjust" a damper means to place or leave one or more elements of the damper to achieve desired flow characteristics through the damper, such as open, closed, or partially open. For example, in a system with eighteen passive cooling systems, adjusting the exhaust air dampers may include opening at least some selected exhaust air dampers in eight of the passive cooling systems and keeping at least some exhaust air dampers closed in the other ten passive cooling systems.

As used herein, a "headwind" refers to an airflow flowing with, respect to a surface, in a direction which is at least partially opposite of the direction in which the surface faces. For example, an airflow flowing towards a surface is a headwind with respect to the surface. Where the headwind flows directly towards the surface, the headwind can at least partially impinge on the surface.

As used herein, "impingement" refers to a direct air flow which contacts a surface. Such a contacting flow is referred to as "impinging" on the surface. Where the surface includes a flow vent through which other air flows in an at least partially opposing direction as the "impinging" air flow, the impinging air flow may at least partially obstruct the opposing air flow out of the flow vent of the impinged surface.

FIG. 1 is a cross-sectional schematic view of a data center that includes an upright exhaust plenum module according to some embodiments. Data center 100 includes a data center structure 101, which includes roof elements 114A-B, encompassing an enclosure 102 in which one or more sets 104 of computer systems are installed. Air intake vents 108 on one or more ends of the data center structure 101 can receive ambient air 132 and direct the air into one or more air handling systems 106. The air handling systems, which can include one or more air cooling systems, air moving devices, etc., can supply cooling air 134 to the one or more sets 104 of computer systems in the enclosure 102 via one or more cooling air conduits 107.

The computer systems in the sets 104 can receive the cooling air 134, where the cooling air 134 can remove heat from one or more heat producing components in one or more of the computer systems, to generate exhaust air 136. The exhaust air may be discharged from the one or more sets 104 of computer systems into the enclosure 102. For example, some embodiments of a set 104 of computer systems can include a computer room from which exhaust air is discharged via one or more exhaust vents on upper sides of the computer room based at least in part upon a chimney effect. Exhaust air 136 can be discharged out of the computer room and into the enclosure 102 in which the computer room is located.

Exhaust air 136 generated by one or more of the computer systems in set 104 can circulate through enclosure 102. In some embodiments, the exhaust air rises into an upper portion of the enclosure 102 based at least in part upon one or more gradients, including a pressure gradient, air density gradient, etc.

Exhaust plenum module 120 is coupled to an upper portion of the data center structure 101. Exhaust plenum module 120 can discharge exhaust air 136 circulating through enclosure 102 into the ambient environment 103. In some embodiments, an exhaust plenum module is coupled to a portion of the data center structure 101 that is configured to direct the exhaust air 136 into an inlet of the exhaust plenum module 120. In the illustrated embodiment, for example, roof elements 114A-B are angled upwards towards exhaust plenum module 120, so that exhaust air 136 that rises through the enclosure 102 is directed towards an inlet 129 of the exhaust plenum module 120.

Exhaust plenum module 120 includes an exhaust plenum 122 within the module. Exhaust air 136 is received into the plenum 122 via the inlet 129 and can be directed as exhaust air flows 138A-B out of the plenum module 120 as airflow 139 into the ambient environment 103 via one or more exhaust vents 123A-B coupled to one or more side ends of the plenum module 120. Plenum module 120 also includes roof elements 124 which obscure the plenum 122 from environmental elements in the ambient environment 103.

In some embodiments, ambient airflow through the ambient environment can restrict exhaust airflow out of the data center 100, which can cause heat buildup in the enclosure 102. Exhaust airflow can be restricted based at least in part upon ambient airflow in the environment 103 impinging on one or more of the exhaust vents. For example, in the illustrated embodiment, where ambient airflow 142 passes through ambient environment 103, at least some ambient airflow 142 impinges on exhaust air vent 123B. The illustrated data center includes a "passive" exhaust plenum module, where the exhaust air flow 138A-B through the plenum 122 and into the ambient environment 103 is induced based at least in part upon one or more gradients from the exhaust plenum 122 towards the ambient environment 103, which can include an air pressure gradient. Where an ambient airflow does not impinge on exhaust air vent 123A, exhaust air flow 138A can pass into the ambient environment 103 as airflow 139. Where ambient airflow 144 impinges on vent 123B, the ambient airflow 144, which may be referred to as an ambient "headwind" with regard to at least vent 123B, may overcome the gradient from plenum 122 into environment 103 across vent 123B, which can restrict or inhibit exhaust air flow 138B through vent 123B. In some embodiments, the impinging airflow 144 can reduce, eliminate, reverse, etc. the gradient across vent 123B. As a result, vent 123B may be render unavailable as surface area to supply exhaust air 136 out of enclosure 102 of the data center structure 101 via plenum module 120. Because the available exhaust area may be reduced, by ambient headwind 144, from the area of at least vents 123A-B to the area of vent 123A, the exhaust air flow out of enclosure 102 via plenum module 120 is restricted, which can result in heat buildup in enclosure 102, performance loss of computer systems in set 104 based on reduced cooling efficiency, increased risk of thermal damage to equipment in the enclosure, increased safety risks to operators in enclosure 102 based on thermal stress, etc.

Figure 2:
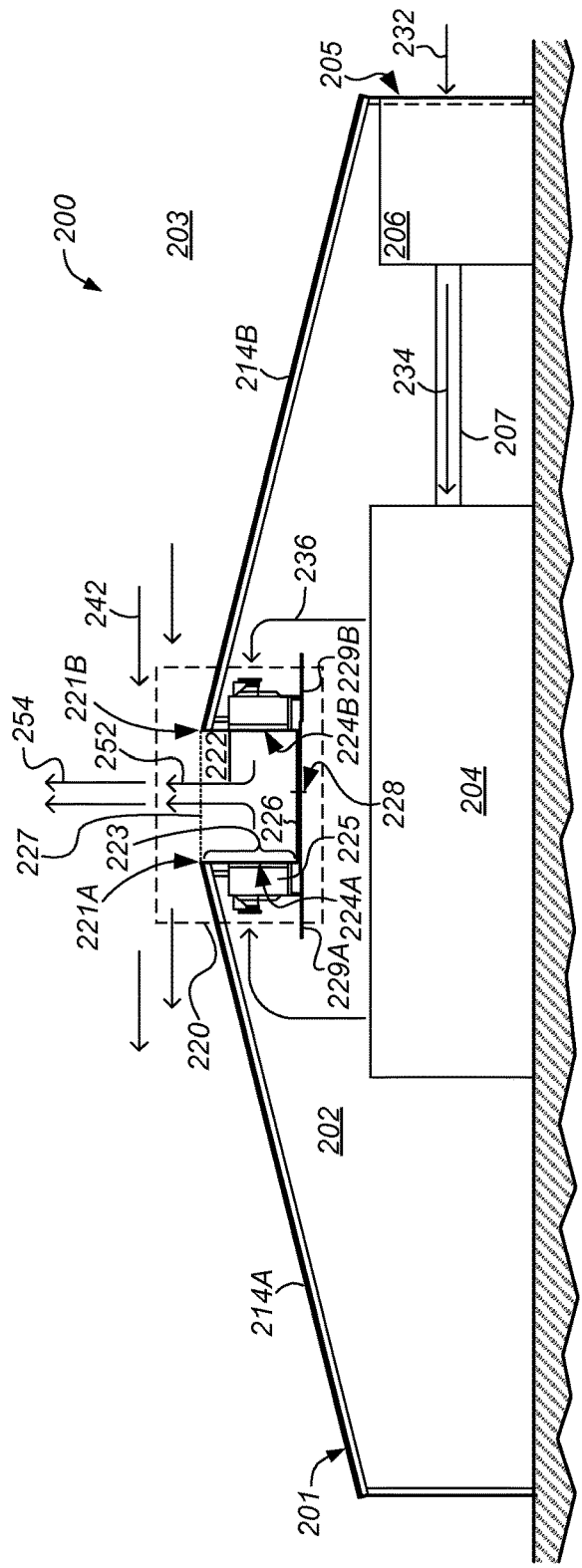
FIG. 2 is a cross-sectional schematic view of a data center that includes an inverted exhaust plenum module according to some embodiments.

FIG. 2 is a cross-sectional schematic view of a data center that includes an inverted exhaust plenum module according to some embodiments. Data center 200 includes a data center structure 201, which includes roof elements 214A-B, encompassing an enclosure 202 in which one or more sets 204 of computer systems are installed. Air intake vents 205 on one or more ends of the data center structure 201 can receive ambient air 232 and direct the air into one or more air handling systems 206. The air handling systems, which can include one or more air cooling systems, air moving devices, etc., can supply cooling air 234 to the one or more sets 204 of computer systems in the enclosure 202 via one or more cooling air conduits 207. Exhaust air 236 generated by one or more of the computer systems in set 204 can circulate through enclosure 202. In some embodiments, the exhaust air rises into an upper portion of the enclosure 202 based at least in part upon one or more gradients, including a pressure gradient, air density gradient, etc.

Exhaust plenum module 220 is coupled to an upper portion of the data center structure 201. Exhaust plenum module 220 is an inverted exhaust plenum module that discharges air received from the enclosure 202 into an exhaust air plenum that projects beneath the one or more roof elements 214A-B of the data center structure 201, rather than above the roof elements. The exhaust plenum module 220 includes wall elements 223 which extend downwards from separate edges 221A-B of the separate roof elements. Such edges may be referred to hereinafter as "roof element edges". In some embodiments, including the illustrated embodiment, one or more of the roof elements 214A-B are angled, so that the separate edges 221A-B are ridges. The separate wall elements 223, as shown in the illustrated embodiment of FIG. 2, extend downward from the separate edges 221A-B and at least partially bound at least opposite side ends of the exhaust plenum 222.

Wall elements 223 include one or more exhaust vents 224A-B which are coupled to respective wall elements 223. The exhaust vents 224A-B direct exhaust air 236 from the enclosure 202 into the exhaust plenum 222. The exhaust plenum 222 is open, on at least an upper end 227 of the plenum 222, to the ambient environment 203. As a result, exhaust air 252 discharged into plenum 222 from an exhaust vent 224A-B can circulate 254 into the ambient environment 203, through the open upper end 227, based at least in part upon one or more various gradients, including air pressure gradients, air density gradients, etc. from the plenum 222 towards the ambient environment 203. In some embodiments, the exhaust vents 224A-B each extend along an entirety of opposite side ends of the exhaust plenum 222, such that wall elements 223 are absent from at least partially bounding the opposite side ends of exhaust plenum 222.

In some embodiments, an inverted exhaust plenum module at least partially obscures exhaust vents from the ambient environment, so that the exhaust vents are at least partially obscured from exposure to impingement by ambient airflow, including ambient headwinds with regard to the vents, that is flowing through the ambient environment. As a result, the inverted plenum module can provide an exhaust air discharge from an enclosure into the ambient environment that is at least partially resistant to restriction by ambient air flows in the ambient environment. In the illustrated embodiment, for example, exhaust vents 224A-B, being located in a plenum 222 that extends beneath the separate edges 221A-B of the roof elements 214A-B, is at least partially obscured from exposure to ambient air flow 242 through the ambient environment 203 and over the roof elements 214A-B. As a result, vents 224A-B can discharge exhaust air 252 into plenum 222 without being impinged upon by ambient airflow, and the discharged airflow can rise out of the plenum 222 as airflow 254 and into the ambient airflow 242 to be removed from the data center 200. Thus, exhaust plenum module can provide exhaust air discharge from enclosure 202 to ambient environment 203 that is at least partially resistant to restriction by ambient air flow 242.

In some embodiments, an inverted exhaust plenum module includes a lower structural element, also referred to hereinafter as a "trough" element 226, which is coupled to a bottom end of one or more of the wall elements. The trough element, as shown in FIG. 2, can span the lower end of the exhaust plenum, between two or more wall elements on opposite side ends of the exhaust plenums, so that the trough element partitions the lower end of the exhaust plenum 222 from enclosure 202. Trough element 226 can comprise multiple trough elements, where each trough element is coupled to a limited selection of wall elements on a limited selection of side ends of the exhaust plenum. For example, one trough element may be coupled to a wall element on one side end of the exhaust plenum 222 and another separate trough element may be coupled to another wall element on the opposite side end of the exhaust plenum 222, where the two trough elements are coupled to each other at a location between the side ends, to establish a trough element that spans between the side ends along the lower end of the exhaust plenum.

In some embodiments, including the illustrated embodiment, the trough element spans between opposite side ends at a flat angle. In some embodiments, the trough element spans between the side ends at one or more nonzero angles. For example, one trough element may extend from one side end towards a midpoint axis 228 of the exhaust plenum 222 at one angle, and another trough element may extend from the opposite side ends towards the midpoint axis 228 at an angle which may be similar or distinct from the angle of the first trough element. As a result, the trough element 226 can be angled to induce a drainage gradient between the side ends that can direct environmental elements, including precipitation, dust, etc. that are received onto the upper surface of one or more of the trough elements towards a certain location, axis 228, etc. of the trough element, from whence the environmental elements can be removed from the data center structure 101 via one or more of a gutter system, a drainage gradient along the axis 228 of the trough element, some combination thereof, or the like.

In some embodiments, one or more air moving devices 225 are coupled to one or more of the respective vents 224A-B and can induce an airflow of the exhaust air 236 into plenum 222. One or more catwalk structures 229A-B, in some embodiments, can be installed proximate to a respective one of the vents 224A-B. One or more vents 224A-B, air moving devices 225, etc. can be accessed manually via a respective catwalk structure 229.

In some embodiments, an exhaust plenum module 220 includes wall elements 223, extending downwards from separate roof elements 214A-B of separate structures 201, where exhaust vents 224A-B in separate wall elements 223 can discharge exhaust air 236 from separate enclosures 202 of separate structures 201 into the plenum 222 which is at least partially located between the separate structures 201.

Figure 3:
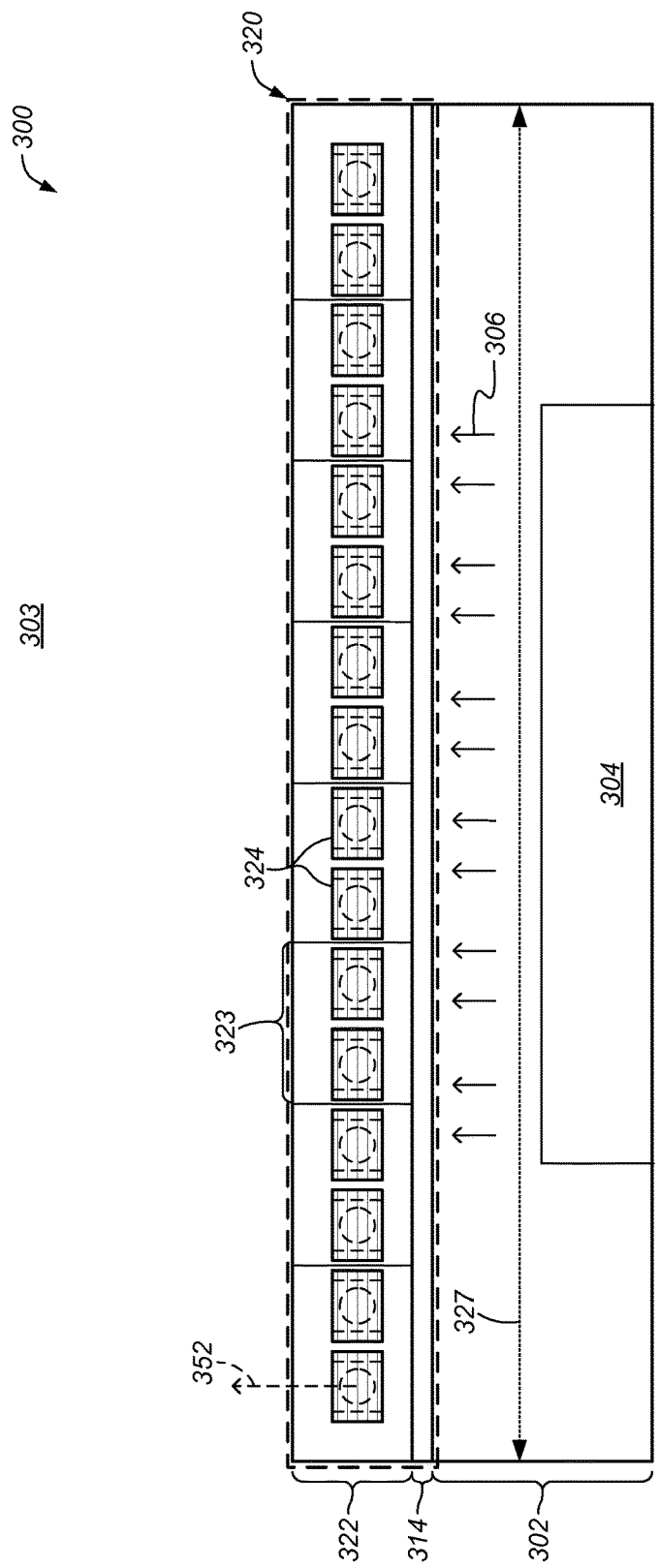
FIG. 3 is a cross-sectional schematic view of a data center structure that includes an inverted exhaust plenum module according to some embodiments.

FIG. 3 is a cross-sectional schematic view of a data center structure that includes an inverted exhaust plenum module according to some embodiments.

Data center structure 300 includes an enclosure 302 in which one or more sets 304 of computer systems are located. The computer systems in each set 304 can include one or more rows of racks in which computer systems are installed, where the one or more rows of racks are included in one or more computer rooms in enclosure 302. Exhaust air 306 generated by the computer systems in sets 304 can exit the sets 304 and circulate through the enclosure 302. In some embodiments, exhaust air 306 rises from sets 304 to an upper portion of the enclosure 302, based at least in part upon one or more gradients towards the upper portion, including an air density gradient.

Data center structure 300 includes an exhaust plenum module 320 which includes an exhaust plenum 322. Exhaust plenum 322 is established, on side ends, by wall elements 323 that extend along the length 327 of the exhaust plenum 322. In some embodiments, the exhaust plenum 322 includes at least two opposite side ends that extend approximately in parallel with an axis that extends along the length of the exhaust plenum 222. As shown, multiple wall elements 323 can establish a side end along the length 327 of plenum 322.

In some embodiments, including the illustrated embodiment, exhaust plenum 322 is established, on a lower end, by a trough element 314 which extends along the length 327 of the exhaust plenum 322. In the illustrated embodiment, trough element 314 extends along the length 327 at a flat slope. It will be understood that, in some embodiments, one or more trough elements extending along the length 327 of the exhaust plenum 322 can be angled perpendicular to the length 327, so that the trough element is sloped towards an axis extending along at least a portion of length 327.

In some embodiments, one or more of the wall elements 323, trough elements 314, etc. partition the exhaust plenum 322 from the enclosure 302, so that exhaust air 306 circulating through enclosure 302 is restricted from circulating into plenum 322 through the spaces in which one or more of the wall elements 323, trough elements 314 extend.

Data center structure 300 includes one or more exhaust vents 324 which are coupled to one or more of the wall elements 323 extending along one or more side ends of the exhaust plenum 322 of exhaust plenum module 320. The exhaust vents can discharge exhaust air 306 circulating through enclosure 302 into the plenum 322. In the illustrated embodiment, where the plenum 322 is open to the ambient environment 303 on at least an upper end, exhaust air 352 discharged into plenum 322 from exhaust vents 324 can circulate into the ambient environment 303 via one or more of a pressure gradient, air density gradient, some combination thereof, or the like. In some embodiments, the plenum 322 is open on one or more side ends not encompassed by one or more wall elements. For example, in the illustrated embodiment, plenum 322 is not encompassed by wall elements at opposite ends of length 327. Exhaust air 352, environmental elements received onto the upper surface of trough element 314, etc., can pass into the ambient environment 303 from plenum 322 via the opposite open side ends. In some embodiments, one or more of the exhaust vents 324 includes one or more air moving devices which induce an airflow from enclosure 302 to plenum 322. The air moving device can be coupled to a vent 324 on an enclosure 302-facing side of the vent 324, so that the air moving device is at least partially located within the enclosure 302.

In some embodiments, one or more portions of data center structure 300 are at least partially included in data center structure 201, illustrated and discussed above with reference to FIG. 2.

Figure 4:
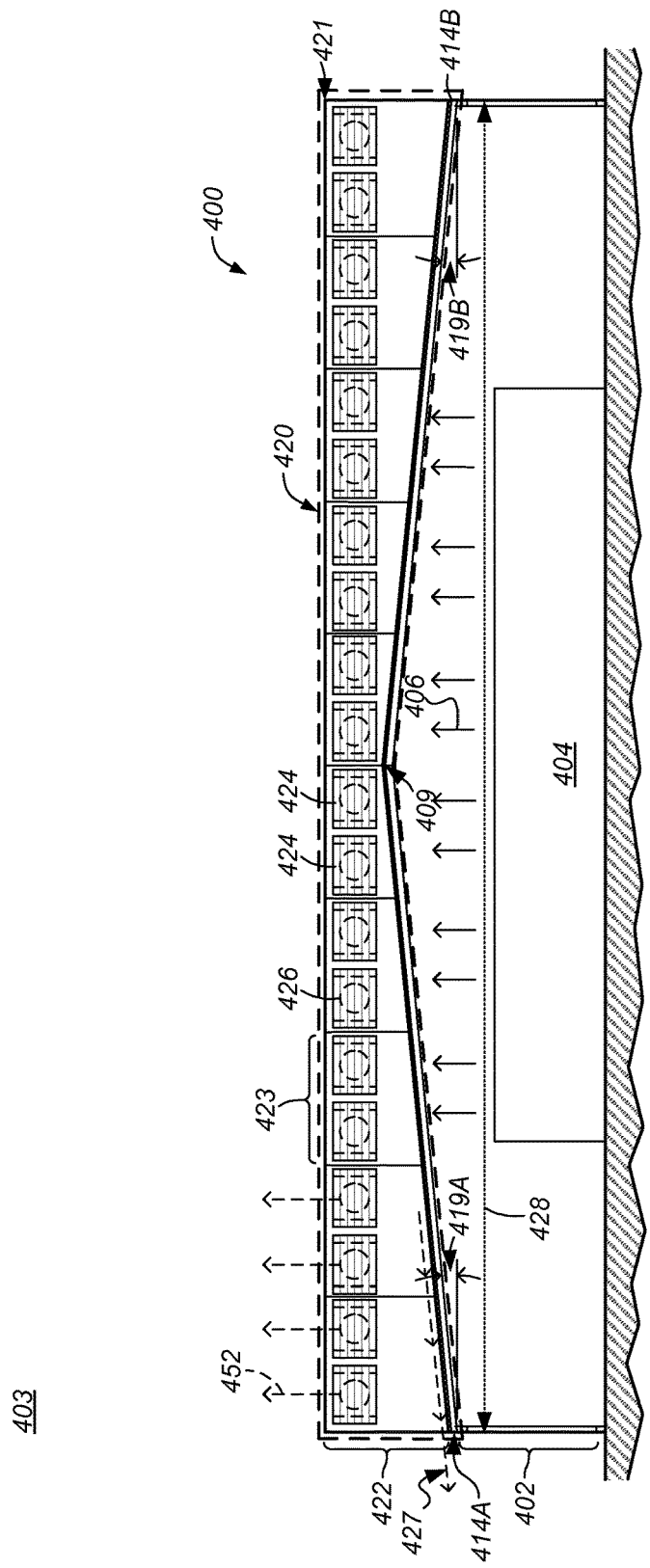
FIG. 4 is a cross-sectional schematic view of a data center structure that includes an inverted exhaust plenum module according to some embodiments.

FIG. 4 is a cross-sectional schematic view of a data center structure that includes an inverted exhaust plenum module according to some embodiments.

Data center structure 400 includes an enclosure 402 in which one or more sets 304 of computer systems are located. The computer systems in each set 404 can include one or more rows of racks in which computer systems are installed, where the one or more rows of racks are included in one or more computer rooms in enclosure 402. Exhaust air 406 generated by the computer systems in sets 404 can exit the sets 404 and circulate through the enclosure 402. In some embodiments, exhaust air 406 rises from sets 404 to an upper portion of the enclosure 402, based at least in part upon one or more gradients towards the upper portion, including an air density gradient.

In some embodiments, the upper portion of the enclosure 402 is angled, so that exhaust air 406 rising into the upper portion is directed to one or more particular regions of the upper portion. In the illustrated embodiment, where the upper portion of enclosure 402 is "peaked" via separate anglings towards a midpoint 409, exhaust air 406 may be directed, via one or more gradients including a pressure gradient, air density gradient, etc., towards a region of the upper portion proximate to the midpoint 409.

Data center structure 400 includes an exhaust plenum module 420 which includes an exhaust plenum 422. Exhaust plenum 422 is established, on side ends, by wall elements 423 that extend along the length 428 of the exhaust plenum 422. In some embodiments, the exhaust plenum 422 includes at least two opposite side ends that extend approximately in parallel with an axis that extends along the length of the exhaust plenum 422. As shown, multiple wall elements 423 can establish a side end along the length 428 of plenum 422.

In some embodiments, including the illustrated embodiment, exhaust plenum 422 is established, on a lower end, by one or more trough elements 414A-B which extend along the length 428 of the exhaust plenum 422. Various trough elements can, in some embodiments, extend along a portion of the length of the exhaust plenum and can each have separate anglings. In the illustrated embodiment, for example, trough element 414A extends at angle 419A from one end of plenum 322, along length 428, to midpoint location 409, where midpoint 409 can include an axis that spans between opposite side ends of the plenum 322 along which separate wall elements 423 extend. In addition, trough element 414B extends at angle 419B from an opposite end of plenum 322, along length 428, to midpoint location 409. Angles 419A and 419B can be similar or distinct angles. Each trough element 414A, B, extending at a respective angle, can include a drainage gradient along the upper surface of the trough element. In the illustrated embodiment, for example, trough element 414A includes a drainage gradient, established via angle 419A of the trough element 414A, from midpoint 409 to an end of the plenum 322, so that environmental elements 427 received on the upper surface of trough element 414A are directed away from midpoint 409 and out of plenum 422 via an end of the plenum 422. Similarly, trough element 414B includes a drainage gradient established by angle 419B of the trough element 414B, and which can be a different gradient than the gradient for element 414A, which directs environmental elements received onto the upper surface of element 414B away from midpoint 409 and out of plenum 422 via another, opposite end of plenum 422 respective to the end through which environmental elements are directed by element 414A. It will be understood that, in some embodiments, one or more trough elements extending along the length 428 of the exhaust plenum 422 can be angled perpendicular to the length 428, so that the trough element is sloped towards an axis extending along at least a portion of length 428. In some embodiments, environmental elements passing out of one or more ends of plenum 422 fall into one or more gutter systems mounted proximate to the end of the plenum 422. In some embodiments, the environmental elements may be directed, from one or more trough elements 414A-B, onto another roof element that is proximate to the end of the plenum 422. Where an end of the plenum 422 is at a sidewall of data center 400, the environmental elements directed out of the end of the plenum 422 can fall along the sidewall.

In some embodiments, one or more partition elements, including one or more screen elements, are mounted at one or more ends of plenum 422. The partition elements can be semi-permeable, so that environmental elements directed out of an end of the plenum 422 can pass through the partition elements, while the partition elements can at least partially obscure a view of the plenum 422 from ambient environment 403. For example, one or more partition elements coupled to an end of a plenum 422 can be translucent, opaque, etc.

In some embodiments, one or more of the wall elements 323, trough elements 314, etc. partition the exhaust plenum 322 from the enclosure 302, so that exhaust air 306 circulating through enclosure 302 is restricted from circulating into plenum 322 through the spaces in which one or more of the wall elements 323, trough elements 314 extend.

Data center structure 400 includes one or more exhaust vents 424 which are coupled to one or more of the wall elements 423 extending along one or more side ends of the exhaust plenum 422 of exhaust plenum module 420. The exhaust vents 424 can discharge exhaust air 406 circulating through enclosure 402 into the plenum 422. In the illustrated embodiment, where the plenum 422 is open to the ambient environment 403 on at least an upper end, exhaust air 452 discharged into plenum 422 from exhaust vents 424 can circulate into the ambient environment 403 via one or more of a pressure gradient, air density gradient, some combination thereof, or the like. In some embodiments, the plenum 422 is open on one or more side ends (e.g., side end 421 is illustrated) not encompassed by one or more wall elements. For example, in the illustrated embodiment, plenum 422 is not encompassed by wall elements at opposite ends of length 428. Exhaust air 452, environmental elements received onto the upper surface of trough elements 414A-B, etc., can pass into the ambient environment 403 from plenum 422 via the opposite open side ends. In some embodiments, one or more of the exhaust vents 424 includes one or more air moving devices 426 which induce an airflow from enclosure 402 to plenum 422. The air moving device can be coupled to a vent 424 on an enclosure 402-facing side of the vent 424, so that the air moving device is at least partially located within the enclosure 402.

In some embodiments, one or more exhaust vents, air moving devices, etc. in plenum module 420 are sized differently from other vents, air moving devices, etc. based at least in part upon the position in the module 420 of the wall element 423 to which the vent 424 is coupled. In the illustrated embodiment, where trough elements 414A-B are angled towards midpoint 409, the enclosure 402 is "peaked" so that exhaust air 406 may be directed to an upper portion of enclosure 402 beneath midpoint 409. As a result, the exhaust air flow rate may be greater through a vent 424 of a wall element 423 that is closer to midpoint 409 than a vent 424 of a wall element 423 that is closer to an open end of the plenum 422. Therefore, one or more vents 424 of wall elements 423 that are proximate to midpoint 409 may have an available exhaust area, which may be understood to refer to the surface area of the exhaust vent through which exhaust air can flow, that is different than the available exhaust area of one or more vents 424 coupled to a wall element 423 that is distal from the midpoint 409. In some embodiments, air moving devices may be coupled to some vents and not others, based at least in part upon vent proximity to the midpoint 409. For example, an air moving device may be coupled to a vent 424 that is coupled to a wall element 423 that is distal from midpoint 409, while a vent 424 that is coupled to a wall element 423 that is proximate to midpoint 409 may not be coupled to an air moving device.

In some embodiments, one or more portions of data center structure 400 are at least partially included in data center structure 201, illustrated and discussed above with reference to FIG. 2.

Figure 5:
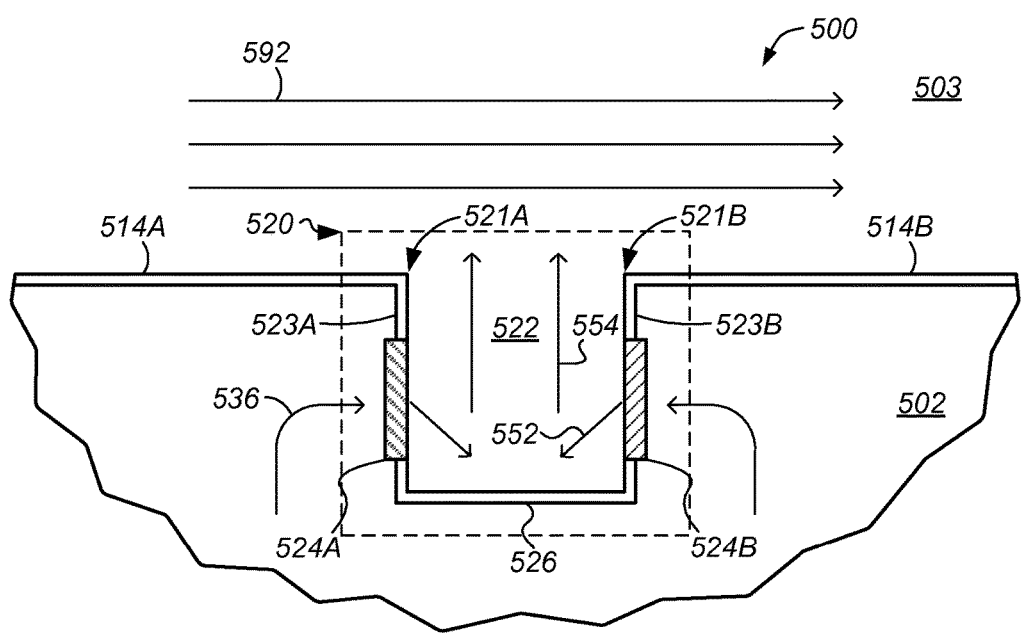
FIG. 5 is a cross-sectional schematic view of a portion of a data center structure that includes an inverted exhaust plenum module and flat roof elements according to some embodiments.

FIG. 5 is a cross-sectional schematic view of a portion of a data center structure that includes an inverted exhaust plenum module and flat roof elements according to some embodiments.

Data center structure 500 includes roof elements 514A-B, encompassing an enclosure 502. Exhaust air 536 can circulate through enclosure 502. In some embodiments, the exhaust air rises into an upper portion of the enclosure 502 based at least in part upon one or more gradients, including a pressure gradient, air density gradient, etc.

Data center structure 500 includes exhaust plenum module 520. Module 520 includes a plenum 522, which projects beneath respective edges 521A-B of the separate roof elements 514A-B and is bounded on side ends by respective wall elements 523A-B. In some embodiments, including the illustrated embodiment, the plenum 522 is bounded on a lower end by a trough element 526, so that the plenum 522 is open, on an upper end spanning between the separate edges 521A-B, to the ambient environment 503. Wall elements 523A-B can include exhaust vents 524A-B which can discharge 552 exhaust air 536 from the enclosure 502 into the plenum 522, from when the exhaust air can pass 554 into the ambient environment 503 via one or more gradients. In some embodiments, the vents direct the discharge 552 of exhaust air into a lower portion of the plenum 522. In some embodiments, one or more of the vents 524 can discharge 552 into one or more various portions of the plenum 522, including a lower portion, upper portion, midway portion, etc. In some embodiments, one or more portions of the vents can be adjusted to adjust the portions of the plenum 522 into which the exhaust air is discharged 522. For example, one or more louvers included in a vent 524 can be adjusted to direct the discharged exhaust air 552 upwards into the plenum 522, downwards into the plenum 522, etc.

In some embodiments, the roof elements 514A-B are not angled, and the exhaust plenum 522 of the module 520 extends beneath the elevation of the roof elements. As a result, exhaust plenum 522 may be obscured from ambient airflows 592 through the ambient environment above the roof elements 514A-B, and vents 524A-B may each be obscured from exposure to impingement by the ambient airflows above the roof elements 514A-B.

In some embodiments, one or more portions of data center structure 500 are at least partially included in data center structure 201, illustrated and discussed above with reference to FIG. 2.

Figure 6:
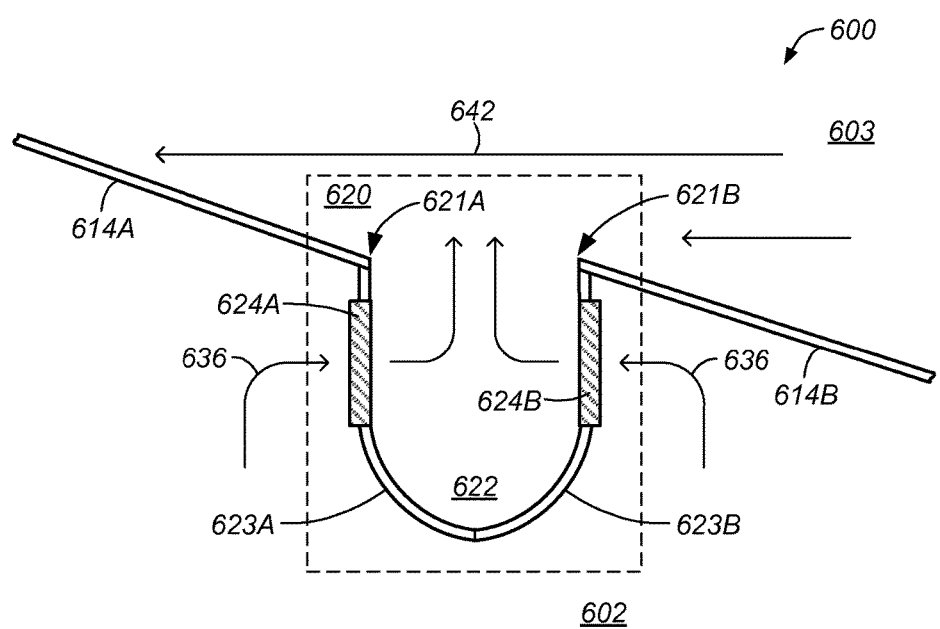
FIG. 6 is a cross-sectional schematic view of a portion of a data center structure that includes an inverted exhaust plenum module with curved wall elements and angled roof elements according to some embodiments.

FIG. 6 is a cross-sectional schematic view of a portion of a data center structure that includes an inverted exhaust plenum module with curved wall elements and angled roof elements according to some embodiments.

In some embodiments, an exhaust plenum module includes a plenum that is bounded by wall elements and is not bounded by trough elements. Such wall elements bounding such a plenum can extend to bound one or more lower ends of the plenum. In the illustrated embodiment, for example, data center structure 600 includes an exhaust plenum module 620 which itself includes a plenum 622 which extends beneath respective edges 621A-B of roof elements 614A-B. The module 620 includes wall elements 623A-B which extend downwards from respective edges 621A-B along opposite side ends of the plenum 622 to partition at least the opposite side ends from enclosure 602 of the data center structure 600.

Wall elements 623A-B are each curved and extend along curved lower ends of plenum 622 to collectively partition the lower end of the plenum 622 from enclosure 602. Each wall element 623 additionally includes at least one exhaust vent 624A-B which discharges exhaust air 636 from enclosure 602 into plenum 622, from whence the exhaust air can pass into ambient environment 603 via one or more gradients from the plenum 622 towards the ambient environment 603. Such a gradient can include one or more of a pressure gradient, air density gradient, etc. Furthermore, exhaust plenum 622 is at least partially obscured from ambient airflows 642 through the ambient environment 603 above the roof elements 614A-B, and vents 624A-B may each be at least partially obscured from exposure to impingement by the ambient airflows above the roof elements 614A-B. For example, vent 624B is obscured from exposure to impingement by the illustrated ambient airflow 642, and vent 624A is at least partially obscured from exposure to impingement by the illustrated ambient airflow 642.

In some embodiments, one or more portions of data center structure 600 are at least partially included in data center structure 201, illustrated and discussed above with reference to FIG. 2.

Figure 7:
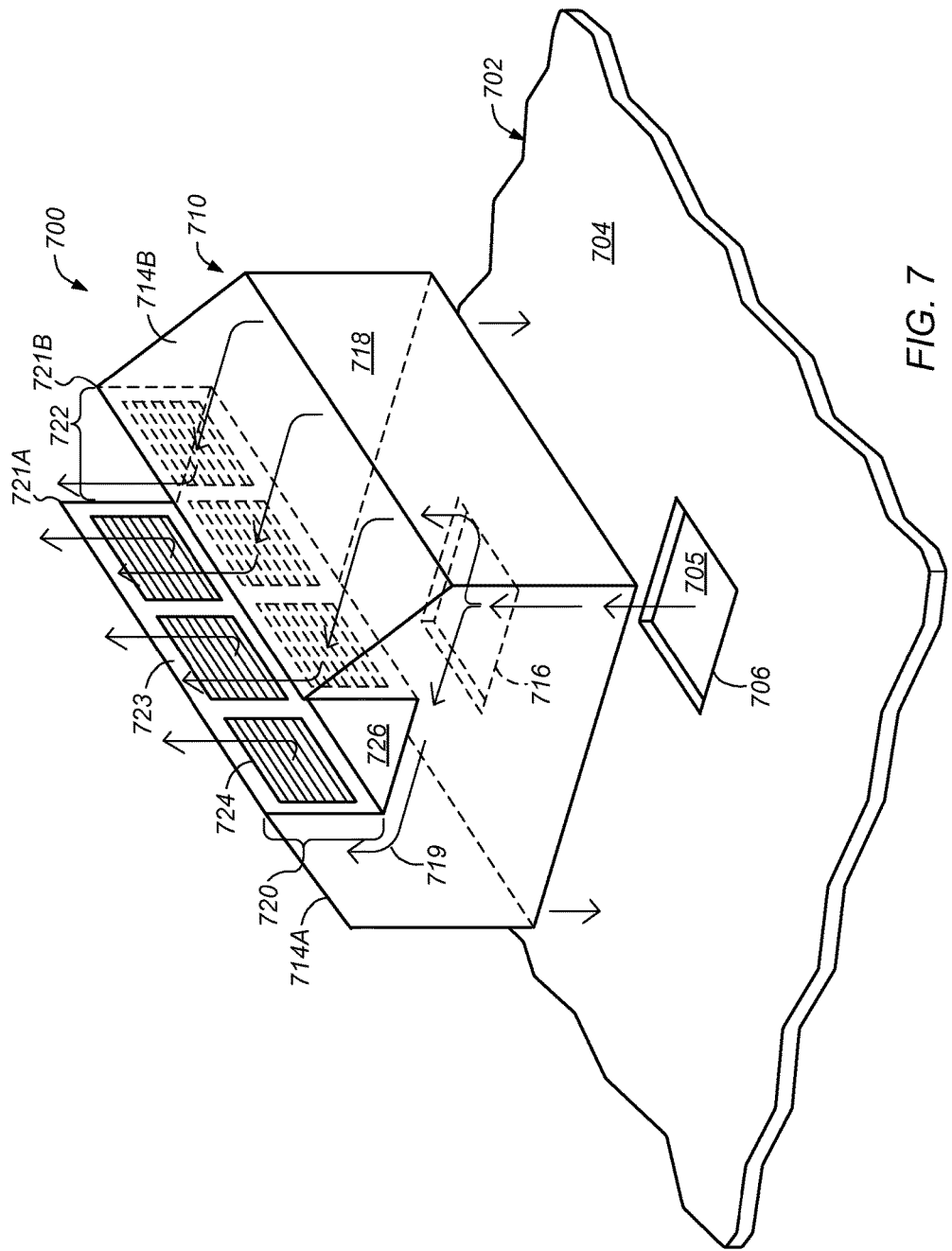
FIG. 7 is a perspective schematic view of a portion of a data center structure and a separate exhaust plenum module that can be coupled to an exhaust outlet of the data center structure according to some embodiments.

FIG. 7 is a perspective schematic view of a portion of a data center structure and a separate exhaust plenum module that can be coupled to an exhaust outlet of the data center structure according to some embodiments.

In some embodiments, an exhaust plenum module is separate from a data center structure. The exhaust plenum module can be coupled to a portion of the data center structure, including a roof element of the data center structure, which includes an exhaust outlet from the data center structure enclosure, so that exhaust air from the enclosure is received into a separate enclosure of the exhaust plenum module and discharged from the plenum module enclosure into an inverted exhaust plenum via exhaust vents.

In the illustrated embodiment, for example, system 700 includes a data center structure 702 and an exhaust plenum module 710. Data center structure 702 includes a roof element 704 and an exhaust air outlet 706. The outlet 706 is in flow communication with an enclosure 705 of the data center structure 702 and can discharge exhaust air from such an enclosure 705. Exhaust air may flow from the data center structure enclosure 705 through outlet 706 based at least in part upon one or more gradients, including a pressure gradient, air density gradient, etc. across the outlet 706.

Exhaust plenum module 710 includes a module enclosure 718, which is at least partially enclosed by various structural elements, including roof elements 714A-B. At least one structural element enclosing portions of the enclosure 718, including the illustrated bottom structural element, includes an air inlet 716 which can receive air into the enclosure 718. Where module 710 is coupled to at least outlet 706 of the data center structure 702, exhaust air 719 from the data center structure 702 enclosure 705 can pass into enclosure 718 of module 710 via outlet 706 and inlet 716. In some embodiments, module 710 is coupled to roof element 704 to couple inlet 716 to outlet 706. The exhaust air 719 can circulate through enclosure 718, including rising to an upper portion of enclosure 718 based at least in part upon one or more gradients through the enclosure 718.

Exhaust plenum module 710 includes an exhaust plenum 722 which extends beneath the separate edges 721A-B of the respective roof elements 714A-B of module 710. The plenum 722 extends along a length of the module 710, and the edges 721A-B likewise extend along the same length. Wall elements 723 of a height 720 extend along opposite side ends of plenum 722 along the length of the plenum and extend downwards from respective edges 721A-B to at least partially bound the opposite side ends of plenum 722. Trough element 726 extends along a lower end of plenum 722 and spans between the separate wall elements that extend along the opposite side ends. In the illustrated embodiment, at least two side ends are open, specifically the side ends located at opposite ends of the length of plenum 722. In some embodiments, wall elements extend along each of the side ends of the exhaust plenum in an exhaust plenum module.

The illustrated wall elements 723 each include one or more exhaust vents 724 which can discharge exhaust air 719 from the enclosure 718 into the plenum 722, from where the exhaust air can exit the plenum into an ambient environment via one or more ends of the plenum, including the top end, which is open to the ambient environment. Exhaust vents can include one or more of a set of louvers, an air moving device, etc. The louvers can direct the discharged exhaust air into a certain portion of the plenum, including a lower portion, and can direct environmental elements received onto the louvers from the ambient environment away from the vent.

In some embodiments, an exhaust plenum module 710 that is separate from the data center structure can be removably coupled to an exhaust outlet 706 of the data center structure 702 to provide a discharge of exhaust air, from the data center structure enclosure 705 to the ambient environment, that is at least partially obscured from exposure to impingement by ambient airflow in the ambient environment. A gradient, including one or more of a pressure gradient, air density gradient, etc., from the data center structure enclosure 705, through the module enclosure 718, through plenum 722, and into the ambient environment can induce exhaust air 719 flow through the module 710.

Figure 8:
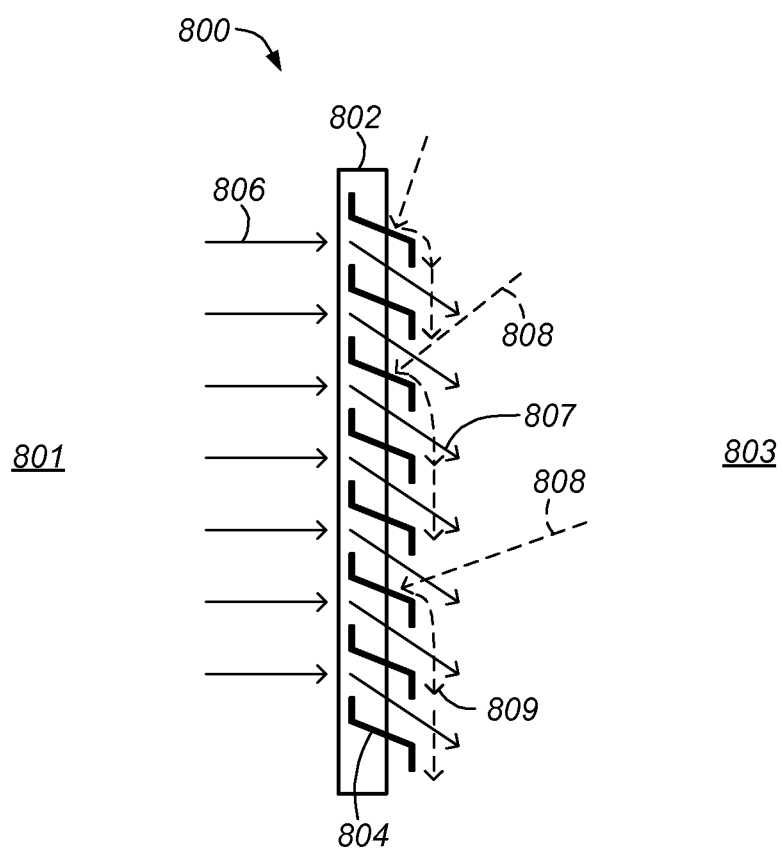
FIG. 8 is a cross-sectional schematic view of an exhaust vent that includes a set of louvers according to some embodiments.

FIG. 8 is a cross-sectional schematic view of an exhaust vent that includes a set of louvers according to some embodiments.

System 800 includes an exhaust vent 802 which is located between an interior enclosure 801 and an exterior space 803, which can include an exhaust plenum. Exhaust vent 802 discharges exhaust air 806 from the enclosure 801 into the exterior space 803.

In some embodiments, and exhaust vent includes one or more sets of louvers which can direct the flow of air through the vent into one or more particular directions of flow. The louvers may be constructed in a fixed position so that the airflow is directed into a particular direction. In the illustrated embodiment, for example, exhaust vent 802 includes a set of louvers 804 which are in a fixed position that directs airflow 801 passing through the vent 802 into a downwards flow direction. In some embodiments, one or more sets of louvers comprise one or more adjustable dampers which can be adjustably controlled to adjust the flow direction of air 806 into the exterior space 803. For example, the one or more sets of louvers may be adjustable to adjust the flow direction of air 806 into an upwards flow direction into an upper portion of the exterior space 803. Louvers can be coupled to an outer frame of the exhaust vent, and extend at least partially through one or more of an interior of the vent, an enclosure 801-facing end of the vent 802, a space 803-facing end of the vent 802, some combination thereof, or the like.

In some embodiments, one or more sets of louvers coupled to an exhaust vent re-direct environmental elements received onto a surface of the vent, including a surface of the louvers, from flowing in one direction to flowing in another direction that proceeds away from the exhaust vent. Such re-direction can at least partially preclude environmental elements, including precipitation, sand, dust, etc., from entering the enclosure 801, where the environmental elements could damage various equipment, including computer systems, located in the enclosure 801.

In some embodiments, a set of louvers can both direct a flow of air from an enclosure through an exhaust vent in one or more particularly directions and can also direct environmental elements received onto a surface of the louvers from another space away from the vent. In the illustrated embodiment, for example, louvers 804, in addition to directing air flow 806 in a particular direction 807, further direct environmental elements 808 which are received onto upper surfaces of one or more of the louvers 804 in the set to fall away from the vent 802, thereby precluding such elements 808 from entering enclosure 801. In some embodiments, louvers 804 direct such environmental elements to fall into one or more gutter systems. In some embodiments, louvers in an exhaust plenum module direct such environmental elements to fall onto an upper surface of a trough element of the exhaust plenum module, where the trough element may include a drainage gradient which directs the environmental elements which are received onto the upper surface along the gradient to one or roe particular locations, which can include exiting the exhaust plenum module.

In some embodiments, one or more portions of system 800 are at least partially included in one or more of data center structure 201 and exhaust plenum module 710, illustrated and discussed above with reference to FIGS. 2 and 7, respectively.

Figure 9:
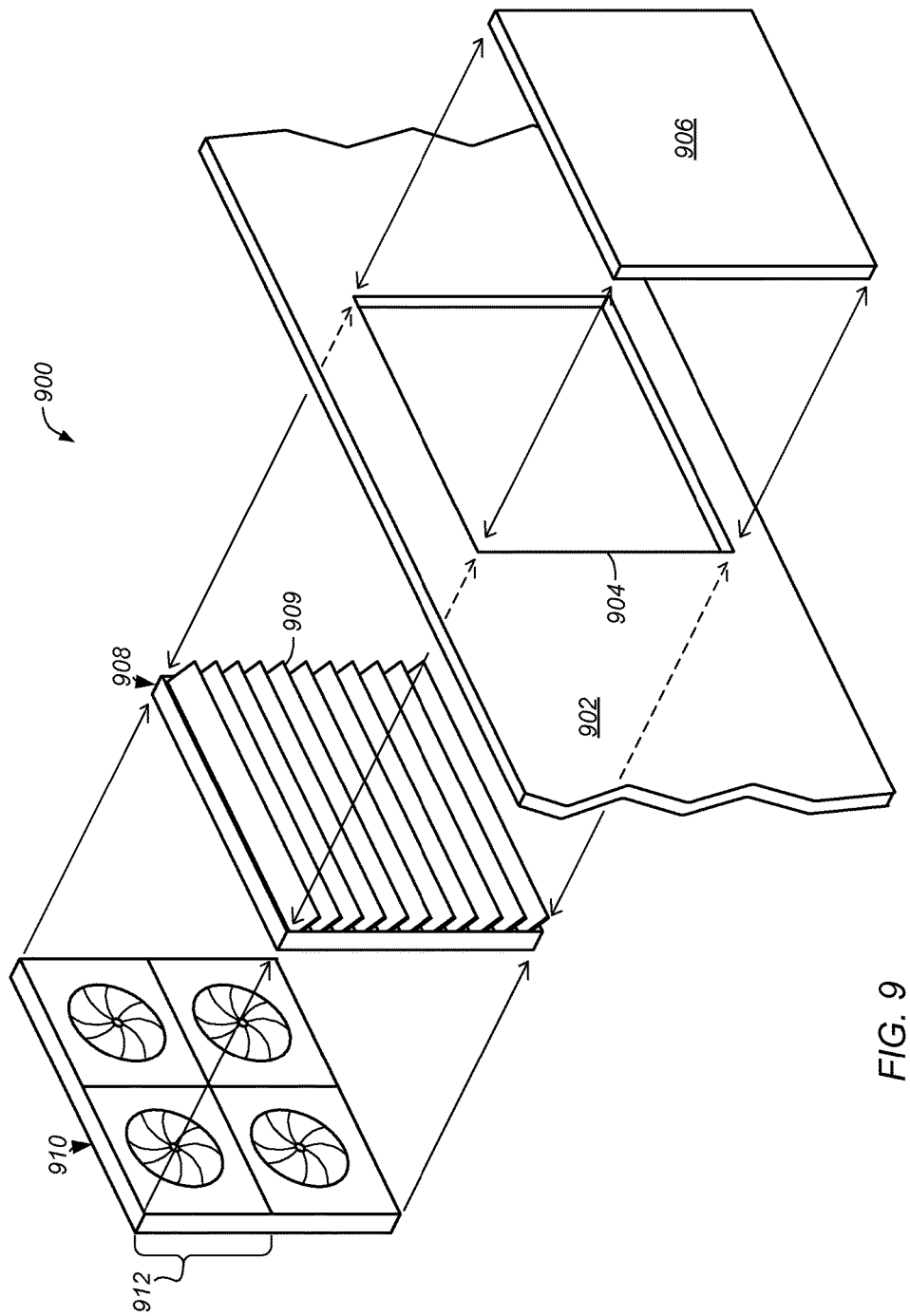
FIG. 9 is a perspective schematic view of a portion of an exhaust plenum module wall element including a portal and a removable partition, exhaust vent, and air moving device array that can be coupled with the portal according to some embodiments.

FIG. 9 is a perspective schematic view of a portion of an exhaust plenum module wall element including a portal and a removable partition, exhaust vent, and air moving device array that can be coupled with the portal according to some embodiments.

System 900 includes a wall element 902 of an exhaust plenum module. The wall element 902 includes at least one portal 904, which is an open space in the wall element 902 that enables flow communication from one side of the wall element to the other side. In some embodiments, a removable panel, including the illustrated removable panel 906, can be coupled to portal 904 to at least partially enclose the portal and restrict airflow between opposite sides of the wall element 902 through the portal 904. The panel 906 can be coupled and decoupled from the portal based at least in part upon the amount of flow between the opposite sides of the wall element 902 that is desired. For example, where exhaust air can flow from an enclosure on one side of the wall element to an exhaust plenum on the opposite side of the wall element 902, panel 906 can be removably coupled or decoupled from portal 904 based at least in part upon the desired pressure gradient between the enclosure and the plenum, the desired flow rate, the desired available exhaust area, some combination thereof, or the like.

In some embodiments, an exhaust vent can be coupled to a portal of a wall element to provide directional discharge of air through the wall element. The vent can provide at least partial preclusion of flow in an opposite direction of the air flow. In the illustrated embodiment, for example, exhaust vent 908 can be coupled to portal 904 to provide discharge of air from an enclosure on one side of the wall element to an exhaust plenum on the opposite side of the wall element 902. The vent 908 can include one or more sets of louvers 909, which can direct an air flow through the portal to flow in one or more particular directions. The louvers 909 can, in some embodiments, re-direct environmental elements received into the plenum away from the enclosure on the opposite side of the wall element.

In some embodiments, one or more air moving devices can be coupled to a portal, where the air moving devices can induce an airflow through the portal between the opposite sides of the wall element. The air moving devices can one or more fans, blowers, etc. In the illustrated embodiment, array 910 includes four air moving devices 912 which are fans. In some embodiments, the air moving devices can be coupled to the portal indirectly; for example, an array 910 of air moving devices 912 can be coupled to an enclosure-facing side of a vent 908 that is inserted into portal 904 to couple the array with the portal and to enable the air moving devices 912 to induce an airflow through the vent 908 and into an exhaust plenum.

As referred to hereinafter, coupling a device, which can include a panel, vent, air moving device, etc., to a wall element portal can include mounting, coupling, inserting, etc. the device at least partially into the portal, through the portal, etc. and securing the device in place, so that the device at least partially fills the open space of the portal.

In some embodiments, one or more portions of system 900 are at least partially included in one or more of data center structure 201 and exhaust plenum module 710, illustrated and discussed above with reference to FIGS. 2 and 7, respectively.

Figure 10:
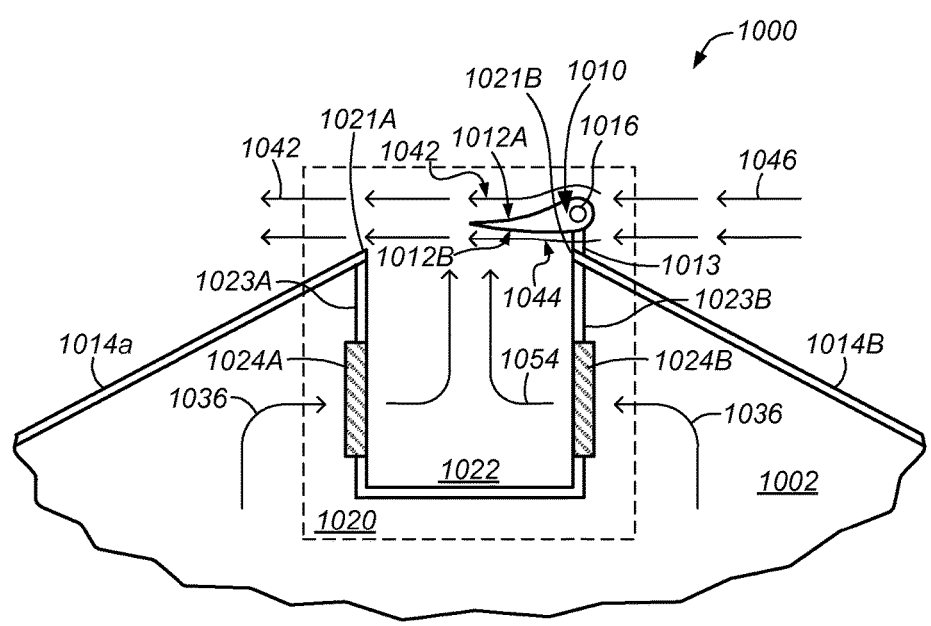
FIG. 10 is a cross-sectional schematic view of a portion of a data center structure that includes an inverted exhaust plenum module and a wing element according to some embodiments.

FIG. 10 is a cross-sectional schematic view of a portion of a data center structure that includes an inverted exhaust plenum module and a wing element according to some embodiments.

In some embodiments, a structural element can be coupled to an exhaust plenum module, where the coupled element induces, augments, etc. air flow from the exhaust plenum module into the ambient environment by lowering the static air pressure on an end of the exhaust plenum module that is open to the ambient environment, thereby establishing or augmenting a pressure gradient from the plenum module to the ambient environment that causes exhaust air discharged into the exhaust plenum of the exhaust plenum module to flow into the ambient environment.

In some embodiments, a structural element that induces, augments, etc. airflow out of the exhaust plenum module includes a "wing" element that applies Bernoulli's principle to reduce static air pressure over at least a portion of a top end of an exhaust plenum module by causing an ambient airflow to flow at a faster flow velocity on a side of the wing element that is proximate to the exhaust plenum of the exhaust plenum module. As the flow velocity increases relative to the ambient airflow upstream of the wing element, the static air pressure of the flow decreases relative to the upstream ambient airflow. The reduced static air pressure of the airflow along the top end of the exhaust plenum can induce, augment, etc. a pressure gradient from the exhaust plenum to the ambient environment across the top end.

In some embodiments, a wing element can reduce the static air pressure over at least a portion of the top end of the exhaust plenum via application of the venturi effect, where the flow of ambient air on a side of the wing element that is proximate to the exhaust plenum flows through a cross sectional flow area that is restricted relative to the cross sectional flow area of the ambient environment. Such a restricted cross sectional flow area can cause the ambient flow to flow at a faster flow velocity, which can cause the air flow to have a reduced static air pressure relative to the upstream ambient air flow which is upstream of the wing element.

In the illustrated embodiment, system 1000 includes an exhaust plenum module 1020, which includes wall elements 1023A-B that extend downwards from edges 1021A-B of separate roof elements 1014A-B to establish side ends of exhaust plenum 1022, and where the wall elements 1023A-B include exhaust vents 1024A-B which discharge exhaust air 1054 received as exhaust air 1036 from an enclosure 1002, enclosed by at least the roof elements 1014A-B and wall elements 1023A-B, into plenum 1022, where the exhaust air can pass 1054 out of the plenum 1022 and into the ambient environment via an open top end which spans between the separate roof element edges 1021A-B.

Exhaust plenum module 1020 includes a wing element 1010 which is coupled to roof element 1014B proximate to edge 1021B. The wing element, in some embodiments, is coupled to one or more elements of the module 1020, including one or more roof elements, roof element edges, wall elements, trough elements, vents, some combination thereof, or the like. Wing element 1010 is coupled to roof element 1014B via a support element 1013 which positions the element 1010 to be elevated above the roof element 1014B, so that a gap exists between a lower surface 1012B of the wing element 1010 and the roof element 1014B. In some embodiments, wing element 1010 is coupled to one or more roof elements 1014A-B to be mounted in a central position between the room element edges 1021A-B over the plenum 1022.

Wing element 1010 includes an upper surface 1012A and a lower surface 1012B, and an ambient airflow 1046 over the roof element 1014B can flow over both surfaces 1012A-B. Wing element 1010 can be shaped so that the airflow 1042 over upper surface 1012A is slower than the airflow 1044 under the lower surface 1012B. The airflow 1044 may be flowing at a faster flow velocity than airflow 1046 upstream of the wing element 1010, which can reduce the static air pressure over at least a portion of the top end of plenum 1022 relative to a static air pressure over a portion of the top end of plenum 1022 where the wing element 1010 is absent.

Wing element 1010 includes an actuator 1016 which can adjust one or more parameters of the attitude of the wing element 1010. Such parameters can include one or more of the pitch, yaw, and roll of the wing element 1010. In some embodiments, actuator 1016 can translate wing element up, down, sideways, away from plenum 1022, towards and over plenum 1022, some combination thereof, etc. The actuator 1016 can adjust various parameters of the wing element 1010 based at least in part upon various properties of the ambient air flow 1046 upstream of the wing element 1010, including flow velocity, flow direction, etc.

In some embodiments, one or more portions of system 1000 are at least partially included in one or more of data center structure 201 and exhaust plenum module 710, illustrated and discussed above with reference to FIGS. 2 and 7, respectively.

Figure 11:
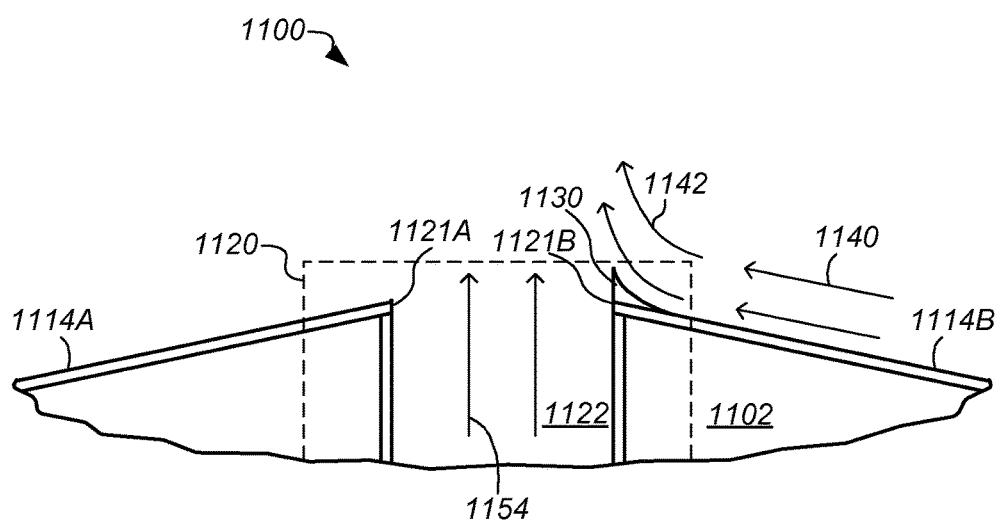
FIG. 11 is a cross-sectional schematic view of a portion of a data center structure that includes an inverted exhaust plenum module and an air directing element coupled to a roof element according to some embodiments.

FIG. 11 is a cross-sectional schematic view of a portion of a data center structure that includes an inverted exhaust plenum module and an air directing element coupled to a roof element according to some embodiments.

In some embodiments, an air directing element can be coupled to one or more portions of an exhaust plenum module, including one or more roof elements, where the air directing element can divert the direction of ambient air flow over at least a portion of the exhaust plenum module. The diversion of ambient flow direction can mitigate exposure to ambient airflow impingement of one or more exhaust air vents in the exhaust plenum module. In some embodiments, the diversion of ambient air flow direction can induce, augment, etc. the flow of exhaust air from the exhaust plenum module to the ambient environment, based at least in part upon reducing the static air pressure at the top end of the exhaust plenum of the exhaust plenum module.

In the illustrated embodiment, data center structure 1100 includes an air directing device 1130 that is coupled to a particular edge 1121B of a roof element 1114B of an enclosure 1102. The air directing device diverts a flow direction of an ambient air flow 1140 over roof element 1114B to flow in a diverted direction 1142. As a result, the static air pressure at the top end of the plenum 1122 of exhaust plenum module 1120 may be reduced relative to if the air directing device 1130 were absent from being coupled to edge 1121B, thereby inducing or augmenting the flow of exhaust air 1154 from plenum 1122 to the ambient environment 1103 via the top end of the plenum 1122. In the illustrated embodiment, while an air directing device 1130 is coupled to edge 1121B of roof element 1114B, no such air directing device is coupled to edge 1121A of roof element 1114A. It will be understood that, in some embodiments, air directing devices can be coupled to separate edges. Air directing devices coupled to separate edges can have different shapes, structures, etc., so that the different air directing devices may divert airflows over separate roof elements towards the exhaust plenum module by different amounts in terms of angular change in flow direction. In some embodiments, one or more air directing elements 1130 can be adjusted to adjust the direction of ambient air flow 1142.

In some embodiments, one or more portions of data center structure 1100 are at least partially included in one or more of data center structure 201 and exhaust plenum module 710, illustrated and discussed above with reference to FIGS. 2 and 7, respectively.

Figure 12:
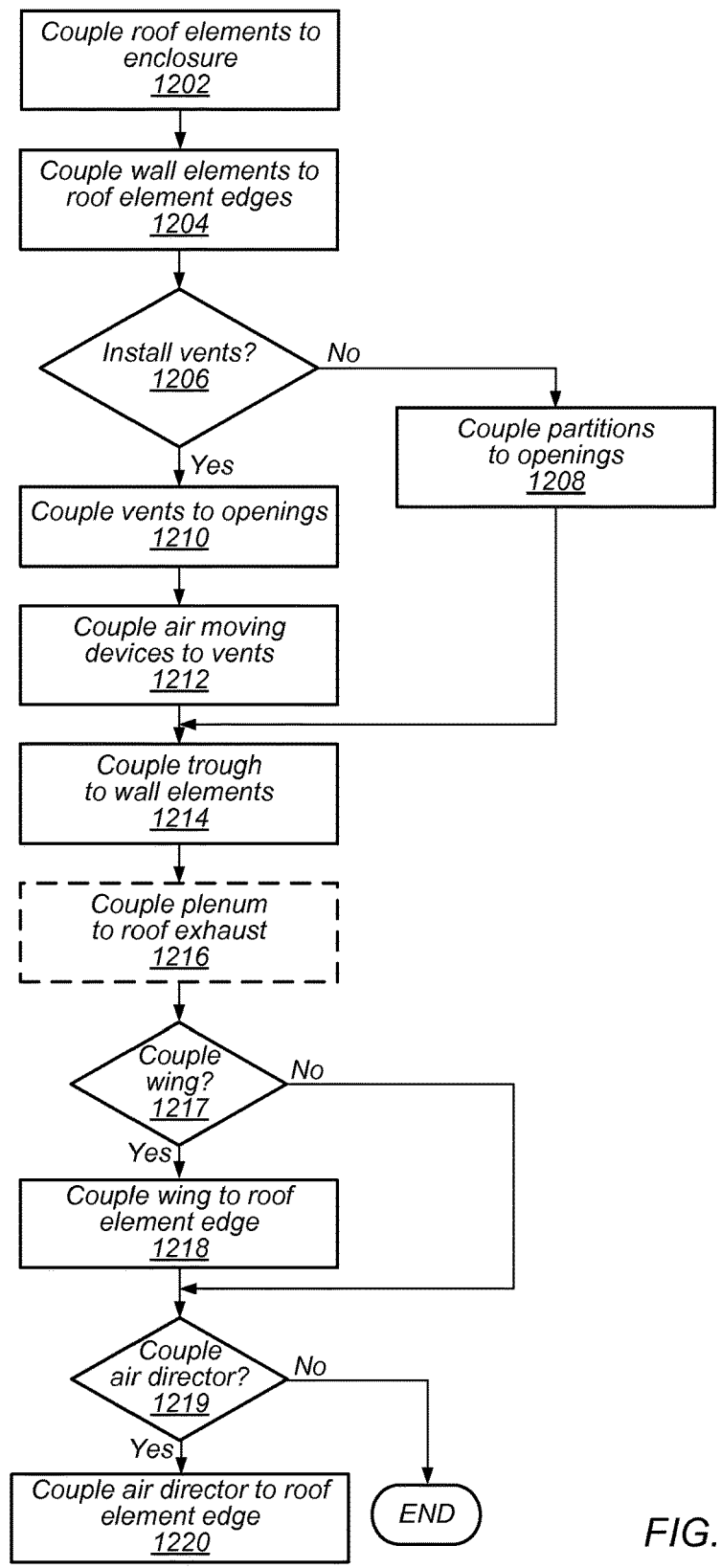
FIG. 12 illustrates configuring an enclosure to provide headwind-resistant air discharge into an ambient environment according to some embodiments.

FIG. 12 illustrates configuring an enclosure to provide headwind-resistant air discharge into an ambient environment according to some embodiments.

At 1202, one or more roof elements are coupled to an enclosure. The roof elements can be coupled to the enclosure to bound at least a portion of a top end of the enclosure. The roof elements can bound a limited portion of the top end, so that there is at least one gap extending between at least two separate roof elements. The gap can be bounded on opposite sides by respective edges of the at least two separate roof elements. The enclosure can include an enclosure of a data center structure in which one or more computer systems are installed and generate exhaust air. In some embodiments, the enclosure is a separate enclosure from the data center structure, and the data center structure includes separate roof elements that bound one or more ends of the data center enclosure. The roof elements can be angled in one or more various angles. In some embodiments, at least some of the roof elements are angled to induce a drainage gradient that induces a flow of environmental elements received onto the roof elements to an outer edge, drain, etc. of the enclosure. In some embodiments, at least some of the roof elements are angled to induce a flow of exhaust air in the enclosure to one or more various locations in an upper portion of the enclosure, including inducing a lateral flow towards one or more locations based at least in part upon relative air density of the exhaust air in the enclosure.

At 1204, wall elements are coupled to the separate roof element edges. The wall elements can be coupled to the separate roof element edges so that each wall element extends downwards from at least its respective coupled roof element edge. The wall elements are coupled to the separate roof element edges to extend downwards to establish side ends of a plenum that extends beneath the separate roof element edges. The plenum may be referred to as an exhaust plenum. The exhaust plenum is at least partially open, on a top end that spans between the separate roof element edges, to the ambient environment, so that air in the exhaust plenum can circulate upwards into the ambient environment based at least in part upon one or more various gradients, including a pressure gradient, air density gradient, some combination thereof, etc. In some embodiments, where the separate roof elements are angled towards the gap between the separate roof elements, coupling the separate wall elements to the separate roof element edges establishes separate ridges between the respective roof elements and the respective coupled wall element. Where a roof element is angled upwards towards the gap, the ridge between the roof element and a coupled wall element may be referred to as a "peak" ridge or "lip" of the exhaust plenum module.

In some embodiments, one or more of the wall elements includes one or more open spaces, also referred to as "portals" that enable open flow communication between the enclosure bounded by the roof elements and the exhaust plenum. At 1206, a determination is made whether to install exhaust vents in the wall elements. If not, at 1208, one or more removable partitions can be coupled to the one or more portals to enclose the portals and restrict airflow between the enclosure and the exhaust plenum through the portals.

If, at 1210, vents are to be installed, one or more exhaust vents are coupled to one or more of the portals in the one or more wall elements. In some embodiments, an exhaust vent includes one or more sets of louvers which can direct airflow through the exhaust vent from the enclosure in one or more various directions. For example, one or more sets of louvers in an exhaust vent may be fixed to direct airflow from the enclosure in a downwards direction towards a lower portion of the exhaust plenum. In some embodiments, one or more sets of louvers comprise dampers which can be adjusted to adjustably control the direction of airflow into the exhaust plenum. In some embodiments, one or more sets of louvers are configured to direct environmental elements that are received into the exhaust plenum from the ambient environment away from an exhaust vent. For example, a set of fixed louvers may be angled, on an external side of the exhaust vent, downwards so that environmental elements, including precipitation, that fall onto one or more of the louvers are diverted downwards and away from the exhaust vent, so that the environmental elements are precluded from entering the exhaust vent, enclosure, etc. One or more sets of louvers, in some embodiments, can direct environmental elements to one or more drains, gutters, etc. which can direct the environmental elements away from the enclosure. At 1212, one or more air moving devices are coupled to one or more of the exhaust vents. The air moving devices can induce an air flow through one or more of the vents into an exhaust air plenum.

In some embodiments, some portals are coupled with removable partitions and some portals are coupled with exhaust vents. Selected portals may be determined to be coupled with partitions or coupled with exhaust vents, and the decision can be revisited at various times based at least in part upon various factors, including exhaust air generation rates by heat producing components, including computer systems, in the enclosure.

At 1214, one or more structural elements, referred to hereinafter as "trough" elements, are coupled to the wall elements to establish a lower end of the exhaust plenum. A trough element can span between wall elements along the lower end of the exhaust plenum. In some embodiments, a trough element is coupled to bottom ends of separate wall elements on separate side ends of the exhaust plenum. In some embodiments, one or more of the trough elements are angled, such that a drainage gradient along the upper surface of the trough elements is established. The drainage gradient can enable environmental elements, including precipitation, that are received into the exhaust plenum and land on the upper surface of the trough element to be directed by the trough element in a direction along the drainage gradient.

At 1216, where the exhaust plenum module is separate from the enclosure in which the exhaust air is generated, as illustrated and discussed above with reference to FIG. 7, the exhaust plenum module is coupled to an exhaust air outlet of an enclosure structure. The exhaust plenum module, itself including an enclosure bounded by the roof elements, wall elements, trough elements, etc., can include an air inlet which can direct air from an external source into the enclosure. Where the exhaust air is generated in a separate enclosure, including an interior enclosure of a data center, the separate enclosure can be enclosed by separate structural elements, which can include separate roof elements. One or more of the separate structural elements can include one or more exhaust air outlets which can direct exhaust air out of the separate enclosure. Coupling the exhaust plenum module to the exhaust air outlet can include coupling the air inlet of the exhaust plenum module with the exhaust air outlet, so that exhaust air can be directed from the separate enclosure in which it is generated into the enclosure of the exhaust plenum module via the coupled exhaust air outlet and air inlet of the exhaust plenum module. Where the exhaust air outlet is included in a roof element of the separate enclosure, the exhaust plenum can be mounted on the roof element to couple the air inlet with the exhaust air outlet.

If, at 1217 and 1218, a wing element to be coupled to the exhaust plenum module, the wing element is so coupled to a roof element edge of the exhaust plenum module. The wing element can induce, augment, etc. air flow of exhaust air out of the exhaust plenum module and into the ambient environment. The wing element is configured to reduce the air pressure at the upper end of the exhaust plenum, so that a pressure gradient is established, augmented, etc. from the exhaust vents to the upper end of the exhaust plenum. As a result of the air pressure being reduced at the upper end, the flow rate of the exhaust air out of the exhaust plenum can be induced, increased, etc. The wing element can be configured to allow an ambient air flow to flow over one or more surfaces of the wing element, where the air flow along the lower surface of the wing element flows faster than the ambient airflow upstream of the wing element, so that the lower airflow has a reduced static air pressure relative to the upstream ambient airflow. The wing element can be configured to establish an upper end of a cross-sectional flow area with a portion of one or more roof elements, including a roof element edge, where the airflow through the cross sectional area has a reduced static air pressure relative to the upstream ambient airflow based at least in part upon a greater flow speed of the airflow through the cross-sectional flow area relative to the upstream ambient airflow. In some embodiments, the wing element is coupled to an edge of one or more of the roof elements and extends at least partially over the upper end of the exhaust plenum. The wing element can include an adjustment mechanism that can adjust the attitude of the wing element, including the pitch, angle of attack to the ambient airflow, etc.

If, at 1219 and 1220, an air directing element is to be coupled to the exhaust plenum module, the air directing element is so coupled to a portion of one or more of the roof elements, including an edge of a roof element. The air directing element can induce, augment, etc. exhaust air flow out of the exhaust plenum based at least in part upon changing a direction of ambient airflow over the exhaust plenum. For example, the air directing element can direct ambient airflow flowing over the roof element upwards, which can enable increased exhaust air flow out of the exhaust plenum relative to exhaust air flow where the ambient air flow flowing over the roof element flows along the upper portion of the exhaust plenum. In some embodiments, one or more wing elements and one or more air directing elements can be coupled to an exhaust plenum module.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
an enclosure in which one or more computer systems are installed, wherein the computer systems discharge exhaust air into the enclosure; and
an inverted exhaust plenum module configured to discharge exhaust air from the enclosure into an ambient environment external to the exhaust plenum, wherein the inverted exhaust plenum module comprises:
at least two angled roof elements at least partially bounding a top end of the enclosure, wherein each of the at least two angled roof elements are angled towards separate edges along the top end;
at least two vertically-oriented wall elements each projecting downwards from separate edges of the roof elements to establish opposite side ends of an exhaust plenum, wherein the exhaust plenum extends downwards beneath the separate edges and comprises an upper end, spanning between the separate edges, the upper end in open flow communication with the ambient environment external to the exhaust plenum; and
at least two exhaust vents that are each coupled to a separate one of the vertically-oriented wall elements and are each configured to discharge exhaust air from the enclosure into the exhaust plenum beneath the separate edges, such that the at least two exhaust vents are each at least partially resistant to restriction by ambient air flowing over the upper end of the exhaust plenum.

2. The data center of claim 1, wherein:
at least one of the exhaust vents comprises at least one air moving device configured to induce an airflow of the exhaust air from the enclosure to the exhaust plenum.

3. The data center of claim 1, comprising:
at least one wing element mounted on at least one of the separate edges, wherein the at least one wing element is configured to reduce air pressure at the upper end of the exhaust plenum to induce airflow out of the exhaust plenum into the ambient environment;
wherein, to reduce air pressure at the upper end of the exhaust plenum, the at least one wing element is configured to induce, via a Bernoulli principle effect, an increase in flow velocity of an ambient air flow along at least a portion of the upper end of the exhaust plenum.

4. The data center of claim 1, wherein:
the inverted exhaust plenum module comprises an exhaust air inlet configured to receive exhaust air into an enclosure space that is separate from the enclosure of the data center;
the inverted exhaust plenum module is configured to be mounted on a roof structure in flow communication with an air exhaust outlet of the roof structure that is in flow communication with the enclosure of the data center, such that exhaust air is directed from the enclosure of the data center and into the separate enclosure of the inverted exhaust plenum module via the exhaust air inlet of the inverted exhaust plenum module; and
to discharge exhaust air from the enclosure into the exhaust plenum, at least one exhaust vent is configured to discharge exhaust air from the separate enclosure into the exhaust plenum.

5. An apparatus, comprising:
an inverted exhaust plenum module configured to discharge exhaust air received from at least one enclosure space into an exhaust plenum that is at least partially obscured from ambient air flows external to the exhaust plenum, wherein the inverted exhaust plenum module comprises:
an exhaust plenum which extends downwards beneath separate roof element edges and comprises an upper end, spanning between the separate roof element edges, the upper end in open flow communication with the ambient environment external to the exhaust plenum; and
at least one exhaust vent that is coupled to at least one side end of the exhaust plenum extending beneath at least one of the separate roof element edges and is configured to discharge exhaust air from at least one enclosure space into the exhaust plenum beneath the separate roof element edges, such that the at least one exhaust vent is at least partially obscured from exposure to impingement by ambient air flows flowing over the upper end of the exhaust plenum.

6. The apparatus of claim 5, wherein:
at least one of the exhaust vents comprises at least one air moving device configured to induce an airflow of the exhaust air from the at least one enclosure space to the exhaust plenum.

7. The apparatus of claim 5, wherein the inverted exhaust plenum module comprises:
a lower trough element extending along a lower end of the exhaust plenum between opposite side ends of the exhaust plenum, wherein the lower trough element is angled downwards towards an outer edge of the at least one enclosure space, in parallel to the opposite side ends, to induce a drainage gradient of environmental precipitation received into the exhaust plenum towards the outer edge of the at least one enclosure space.

8. The apparatus of claim 5, wherein:
the inverted exhaust plenum module comprises an exhaust air inlet configured to receive exhaust air into the at least one enclosure space; and
the inverted exhaust plenum module is configured to be mounted on a roof structure in flow communication with an air exhaust outlet of the roof structure, such that exhaust air received from a separate enclosure, which is separate from the at least one enclosure space, is circulated through the enclosure space of the inverted exhaust plenum module and discharged into the exhaust plenum of the inverted exhaust plenum module.

9. The apparatus of claim 5, wherein:
at least one of the separate roof elements is angled upwards towards the respective separate edge of the separate roof element, such that the separate edge comprises a separate peak of the respective separate roof element along one side of the upper end of the exhaust plenum.

10. The apparatus of claim 5, wherein:
at least one of the exhaust vents comprises at least one set of fixed louvers configured to direct exhaust air discharged from the at least one exhaust vent towards a lower end of the exhaust plenum and to direct environmental precipitation received into the exhaust plenum away from the exhaust vent.

11. The apparatus of claim 5, wherein the inverted exhaust plenum module comprises:
at least one wing element mounted on at least one of the separate edges, wherein the at least one wing element is configured to reduce air pressure at the upper end of the exhaust plenum to induce airflow out of the exhaust plenum into the ambient environment;
wherein, to reduce air pressure at the upper end of the exhaust plenum, the at least one wing element is configured to induce, via a Bernoulli principle effect, an increase in flow velocity of an ambient airflow along the upper end of the exhaust plenum.

12. The apparatus of claim 5, wherein the inverted exhaust plenum module comprises:
at least one air directing element mounted on at least one of the separate edges, wherein the at least one air directing element is configured to reduce air pressure at the upper end of the exhaust plenum to induce airflow out of the exhaust plenum into the ambient environment;

wherein, to reduce air pressure at the upper end of the exhaust plenum, the at least one air directing element is configured to at least partially change a direction of ambient airflow proximate to the upper end of the exhaust plenum.

13. The apparatus of claim 5, wherein:
the at least one side end of the exhaust plenum extending beneath at least one of the separate roof element edges comprises a portal configured to interchangeably accommodate at least one of an exhaust vent configured to discharge exhaust air from the enclosure space into the exhaust plenum or a removable partition configured to enclose the portal to restrict airflow of the exhaust air from the at least one enclosure space into the exhaust plenum via the portal.

14. A method, comprising:
configuring an enclosure to provide an air discharge into an ambient environment external to the enclosure that is at least partially resistant to restriction by ambient air flow, wherein the configuring comprises:
coupling at least two wall elements to separate roof element edges, such that the wall elements extend downwards from separate roof element edges to establish opposite side ends of an open space that is in flow communication with the ambient environment external to the enclosure via an upper end that spans between the separate roof element edges, wherein the open space comprises an exhaust plenum; and
coupling at least one exhaust vent to at least one of the wall elements, wherein the at least one exhaust vent is configured to discharge air into the exhaust plenum beneath the separate roof element edges.

15. The method of claim 14, wherein:
coupling the at least one exhaust vent comprises installing at least one air moving device in flow communication with the at least one exhaust vent; and
the method further comprises operating the at least one air moving device to induce a flow of air from the enclosure to the exhaust plenum via the at least one exhaust vent.

16. The method of claim 14, wherein:
coupling the at least one exhaust vent comprises coupling at least one set of louvers to an exhaust side of the at least one exhaust vent, wherein the at least one set of louvers is configured to direct air discharged from the at least one exhaust vent towards a lower end of the exhaust plenum and to direct environmental precipitation received into the exhaust plenum away from the exhaust vent.

17. The method of claim 14, wherein the configuring comprises:
coupling a lower trough element to a lower end of each of the at least two wall elements, such that the lower trough element extends along a lower end of the exhaust plenum between the at least two wall elements;
wherein the lower trough element is angled downwards towards an outer edge of the enclosure, in parallel to the at least two wall elements, to induce a drainage gradient of environmental precipitation received into the exhaust plenum towards the outer edge of the enclosure.

18. The method of claim 14, wherein the configuring comprises:
coupling at least one wing element to at least one of the separate edges, wherein the at least one wing element is configured to reduce air pressure at the upper end of the exhaust plenum to induce airflow out of the exhaust plenum into the ambient environment;

wherein, to reduce air pressure at the upper end of the exhaust plenum, the at least one wing element is configured to induce, via a Bernoulli principle effect, an increase in flow velocity of an ambient airflow along the upper end of the exhaust plenum.

19. The method of claim 14, wherein:

coupling at least two wall elements comprises installing at least one wall element that comprises an open space;

the configuring further comprises installing a removable partition in the open space to restrict airflow from the enclosure into the exhaust plenum via the open space; and coupling at least one exhaust vent in at least one of the wall elements comprises removing the removable partition from the open space and installing the at least one exhaust vent in the open space to enable airflow from the enclosure to the exhaust plenum via the open space.

20. The method of claim 14, wherein:

configuring an enclosure to provide air discharge into an ambient environment that is at least partially resistant to restriction by ambient air flows comprises coupling an inverted exhaust plenum module to an exhaust air outlet of a separate enclosure, wherein the inverted exhaust plenum module comprises the enclosure, the roof elements, the wall elements, the at least one exhaust vent, and the exhaust plenum;

the exhaust plenum further comprises an air inlet configured to direct air from an external source into the enclosure; and coupling an inverted exhaust plenum module to an exhaust air outlet of a separate enclosure comprises coupling the air inlet of the inverted exhaust plenum module to the exhaust air outlet, such that the enclosure of the inverted exhaust plenum module directs air received from the separate enclosure, via the exhaust air outlet, to the exhaust plenum via the at least one exhaust vent.

\* \* \* \* \*